United States Patent
Kamatani (10) Patent No.: US 8,576,886 B2
(45) Date of Patent: Nov. 5, 2013

(54) LASER DIODE DRIVE CIRCUIT AND IMAGE FORMING APPARATUS INCORPORATING SAME

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 329 days.

(21) Appl. No.: 13/037,574

(22) Filed: Mar. 1, 2011

(65) Prior Publication Data

US 2011/0211606 A1    Sep. 1, 2011

(30) Foreign Application Priority Data

Mar. 1, 2010   (JP) ................................. 2010-044411

(51) Int. Cl.
*H01S 3/00*    (2006.01)

(52) U.S. Cl.
USPC ........................................................ 372/38.02

(58) Field of Classification Search
USPC ................................ 372/31, 50.1, 38.01, 38.02
See application file for complete search history.

(56) References Cited

FOREIGN PATENT DOCUMENTS

| JP | 2000-353851 | 12/2000 |
| JP | 3542472 | 4/2004 |
| JP | 2010-157572 | * 12/2008 |
| JP | 2010-157572 | 7/2010 |

* cited by examiner

*Primary Examiner* — Jessica Stultz
*Assistant Examiner* — Tuan Nguyen
(74) *Attorney, Agent, or Firm* — Cooper & Dunham LLP (57) ABSTRACT

A laser diode drive includes a first photo diode connection terminal to connect a first photo diode that detects light emission amounts of multiple laser diodes, multiple second photo diode connection terminals to connect multiple second photo diodes that detect light emission amounts of the respective multiple laser diodes, multiple APC controllers to control the light emission amounts of the multiple laser diodes based on monitor currents from the first photo diode or the second photo diodes, multiple switches to connect and disconnect the respective APC controllers with a monitor current path formed between the first photo diode connection terminal and the multiple APC controllers, and a detector to detect whether or not the first photo diode is connected to the first photo diode connection terminal and cause all of the switches to disconnect when the first photo diode is not connected to the first photo diode connection terminal.

7 Claims, 8 Drawing Sheets

LASER DIODE DRIVE CIRCUIT AND IMAGE FORMING APPARATUS INCORPORATING SAME

TECHNICAL FIELD

The present disclosure relates to a laser diode drive circuit, and more particularly, to a laser diode drive circuit capable of controlling quantity of laser light both in a multi-beam laser drive system and a single beam laser system.

BACKGROUND ART

Recently, semiconductor laser diodes have come to be widely used in a variety of types of electrical equipment, for example, laser printers, optical disk apparatuses, fiber-optic communication apparatuses, and mobile phones, because of their compact size, low cost, and ease of use.

However, the current/quantity of light characteristic of the semiconductor laser diode is dependent on temperature. Accordingly, it is necessary to control quantity of light to obtain a predetermined quantity of light reliably. This quantity of light control is called Automatic Power Control (APC). In the APC process, before the semiconductor laser diode is actually driven, the laser diode is driven in advance, the quantity of light from the laser diode is received by a photo diode (PD), and the detection current values of corresponding quantities of light are stored in a storage device. Then, the laser diode is controlled using the current values saved in the storage device so as to obtain a desired quantity of light reliably.

Recently, in connection with improvements in writing speed to write data in a storage device such as a semiconductor memory, a multi-beam laser method has come to be widely employed in the image forming apparatus. In the multi-beam laser method, multiple semiconductor lasers are provided to form a laser array, and each semiconductor laser is driven at the same time.

In such an image forming apparatus employing the multi-beam laser method, the photo diodes are installed to perform APC. Generally, in the image forming apparatus using the multi-beam laser method, a number of photo diodes is less than a number of the semiconductor laser diodes, further, only one diode may be employed in some case. By contrast, in the image forming apparatus employing a single beam laser method that will be described later, one photo diode is provided for one corresponding laser diode.

Using the multi-beam laser method described above, it is possible to achieve a high speed image forming apparatus and obtain a high quality image. Accordingly, there is more frequent adoption of the multi-beam laser method in the image forming apparatuses.

At the same time, there is increasing demand for a color image forming apparatus. For the color image forming apparatus, a lot of drive methods to drive lasers that form images by, for example, four color components, yellow (Y), magenta (M), cyan (C), and black (K) have been created.

When the multi-beam laser method is applied to laser diodes for four color components, a complicated and advanced control system is required, resulting in an expensive image forming apparatus. Accordingly, most general-purpose image forming apparatuses commercially used in the office currently employ multiple circuits for the single beam laser method using a laser diode-photo diode integrated (LD-PD) pair type system.

Accordingly, there is increasing demand for the semiconductor laser diode drive circuit which drives multiple laser diodes regardless of whether the single beam laser method is employed or the multi beam laser method is employed.

Currently, when the image forming apparatus employs the multi beam laser system, a special semiconductor laser drive circuit dedicated to the multi beam laser method is used. Further, when the image forming apparatus employs multiple single beam laser systems, multiple special semiconductor laser drive circuits dedicated to the single beam laser method are generally used.

JP-3542472-B and JP-2000-353851-A disclose example circuit configurations of the special semiconductor laser drive circuit dedicated to the multi beam laser method. However, in both circuit configurations, one photo diode is provided for multiple laser diodes corresponding to multiple channels (ch). Accordingly, they are not suitable for the system to drive the single beam laser system with the single beam laser method. When the circuit configurations described therein are applied to the single beam laser system, a special control is required compared to a case of driving a multi beam laser system.

Further, it may be possible to employ multiple semiconductor laser drive circuits dedicated to the single beam laser system to drive lasers of the multi beam laser system, however, a special control is required also. For this reason, it is necessary to develop a special semiconductor laser drive circuit dedicated to the multi beam laser system, or to the single beam laser system with each new system design, resulting in a cost penalty. Further, a relatively long term is required to develop the overall image forming apparatus.

SUMMARY

This patent specification describes a novel laser diode drive circuit. In as aspect of this disclosure, there is provided a laser diode drive circuit drives multiple laser diodes under automatic power control (APC), including a first photo diode, multiple second photo diodes, a first photo diode connection terminal, multiple second photo diode connection terminals, multiple APC controllers, a monitor current path, multiple switches, and a detector. The first photo diode detects light emission amounts of the multiple laser diodes. The multiple second photo diodes corresponding to the respective multiple laser diodes detects light emission amounts of the corresponding laser diodes, and a number of the second photo diodes is the same as a number of the multiple laser diodes. The first photo diode connection terminal connects the first photo diode. The multiple second photo diode connection terminals connect the multiple second photo diodes. The multiple APC controllers are provided for the respective multiple laser diodes. Each of the multiple APC controller controls the light emission amount of one of the multiple laser diodes automatically based on a first monitor current from the first photo diode connected to the first photo diode connection terminal or a second monitor current from a respective one of the multiple second photo diodes connected to the corresponding multiple second photo diode connection terminals. The monitor current path is formed between the first photo diode connection terminal and the respective multiple APC controllers. The first monitor current flows from the first photo diode connection terminal to the corresponding APC controller through the monitor current path. The multiple switches provided for the respective multiple laser diodes connect and disconnect the monitor current path with the respective APC controllers, disposed between the monitor current path and the respective multiple APC controllers. The detector detects whether or not the first photo diode is connected to the first photo diode connection terminal. When the first photo diode is not connected to the first photo diode connection terminal, the detector causes all of the switches to disconnect the monitor current path from the respective APC controllers when the first photo diode is not connected to the first photo diode connection terminal.

Additional aspects, there is provided a laser diode drive circuit to drive multiple laser diodes under automatic power control (APC), including the first photo diode, the multiple second photo diodes, the first photo diode connection terminal, the multiple second photo diode connection terminals, the multiple APC controllers, the monitor current path, the multiple switches, and an input terminal. The input terminal inputs an external photo diode connection signal that indicates whether or not the first photo diode is connected to the first photo diode connection terminal. When the external photo diode connection signal input to the first photo diode connection terminal indicates that the first photo diode is not connected to the first photo diode connection terminal, the input terminal causes all of the switches to turn off between the monitor current path to the respective APC controllers.

Additional aspects, there is provided an image forming apparatus including the above-described laser diode drive circuit.

DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 1A:
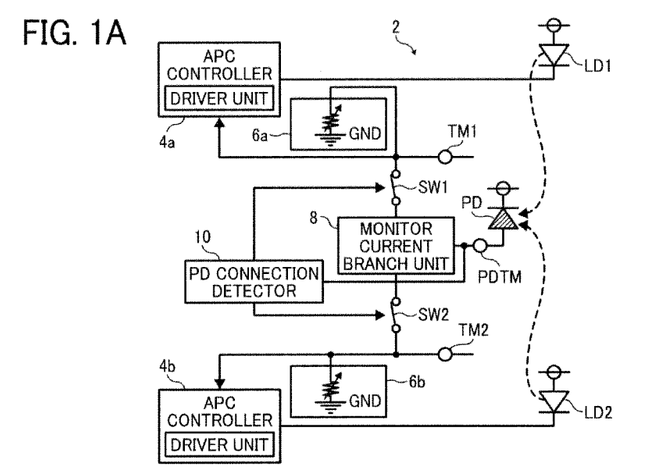
FIGS. 1A and 1B are circuit diagrams of a semiconductor laser diode drive circuit according to a first embodiment.
Figure 1B:
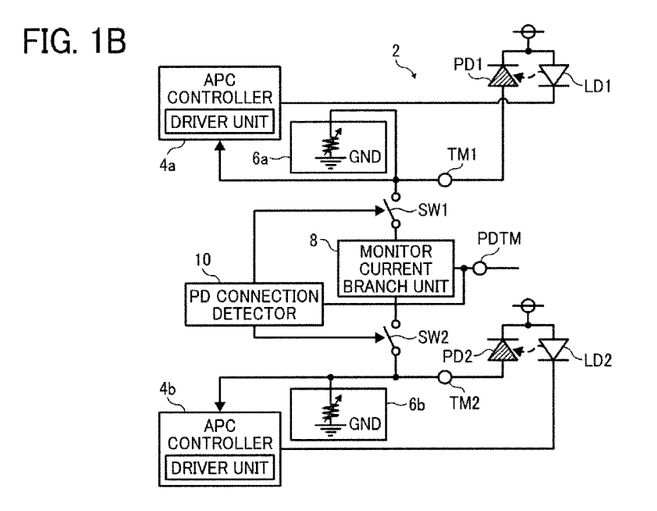

Referring now to the drawings, wherein like reference numerals designate identical or corresponding parts throughout the several views, particularly to FIG. 1, a laser diode drive circuits according to an illustrative embodiment are described.

First Embodiment

FIGS. 1A and 1B are overall views of circuit block diagram of a semiconductor laser diode drive circuit 2 according to an illustrative first embodiment.

FIG. 1A illustrates a circuit configuration when a multi beam laser connection is set. FIG. 1B illustrates a circuit configuration when a single beam laser connection is set.

In the multi beam laser connection shown in FIG. 1A, a 2LD-1PD type 2 channel (ch) multi beam laser connection system is shown. More specifically, two laser diodes LD1 and LD2 and one photo diode PD are employed therein. However, the multi beam laser connection system according to the first embodiment is not limited to this circuit configuration. However, even if a number of beams is equal to and more than 3 (channels), it becomes possible to realize the multi beam connection system similarly based on the teaching shown in FIGS. 1A and 1B.

The multi beam laser connection system shown in FIG. 1A is an anode common type laser unit in which anodes of the laser diodes LD1 and LD2 and a cathode of the one photo diode PD are connected to a stem. It is also possible to achieve the embodiment of the multi beam laser connection system by a cathode common type laser unit in which cathodes of the laser diodes LD1 and LD2 and an anode of the photo diode PD are connected to the stem.

The overall circuit configuration and an operation of the semiconductor laser diode drive circuit 2 according to the first embodiment shown in FIGS. 1A and 1B will be described.

The semiconductor laser diode drive circuit 2 according to the first embodiment includes the laser diodes LD1 and LD2, the photo diode PD for the multi beam laser system, two photo diodes PD1 and PD2 for the single beam laser system, a PD connection terminal PDTM, a monitor current branch unit 8, a PD connection detector 10, APC controllers 4a and 4b, monitor current voltage conversion resistors 6a and 6b, switches SW1 and SW2, and PD monitor current voltage conversion circuit connection terminals TM1 and TM2.

Herein, the photo diode PD functions as a first photo diode, and the photo diodes PD1 and PD2 function as multiple second photo diodes. The PD connection terminal PDTM functions as a first photo diode connection terminal, and the PD monitor current voltage conversion circuit connection terminals TM1 and TM2 function as multiple second photo diode connection terminals.

In the multi beam laser connection as shown in FIG. 1A, one photo diode PD is connected to the PD connection terminal PDTM, the photo diode PD receives a light emission from one of the laser diodes LD1 and LD2. An output current, functioning as a first monitor current, from the photo diode PD generated by receiving the laser light flows towards the monitor current voltage conversion resistor 6a and 6b and the APC controllers 4a and 4b through the monitor current branch unit 8. The monitor current branch unit 8 functions as a monitor current path.

Each driver unit in the APC controllers 4a and 4b outputs a first drive current with a proper amount to drive the laser diodes LD1 and LD2 based on the voltage converted by the monitor current voltage conversion resistors 6a and 6b so that the light emission amount from the laser diodes LD1 and LD2 becomes a predetermined quantity of light, respectively.

By contrast, in the single beam laser connection shown in FIG. 1B, the two photo diodes PD1 and PD2 corresponding to the laser diodes LD1 and LD2 are connected to the PD monitor current voltage conversion circuit connection terminals TM1 and TM2, respectively.

The laser lights from the laser diodes LD1 and LD2 are received by the photo diodes PD1 and PD2, which are disposed to receive laser light from the corresponding laser diodes LD1 and LD2.

The output currents, functioning as second monitor currents, from the photo diodes PD1 and PD2 generated by receiving the laser light flow towards the monitor current voltage conversion resistors 6a and 6b and the APC controllers 4a and 4b, respectively.

Second drive currents from the drive unit in the APC controllers 4a and 4b are output to the laser diodes LD1 and LD2 with a proper amount based on the voltage converted by the monitor current voltage conversion resistor 6a and 6b so that the light emission quantities from the laser diodes LD1 and LD2 become predetermined quantities of light.

A detailed operation of the semiconductor laser diode drive circuit 2 according to the first embodiment is described.

(1.1 Operation in the Multi Beam Laser Connection)

In the multi beam laser connection shown in FIG. 1A, the photo diode PD for the multi beam laser method is connected to the PD connection terminal PDTM. When each of the laser LD1 or LD2 emits light, the photo diode PD receives the light and generates the first monitor current corresponding to emission quantity of the laser light.

The monitor current branch unit 8 bifurcates the first monitor current (upward current and downward current in FIG. 1). The monitor current branch unit 8 may branch the first monitor current from the photo diode directly or the monitor current branch unit 8 may branch the first monitor current after a PD monitor current is amplified by, for example, a current mirror circuit.

Figure 8A:
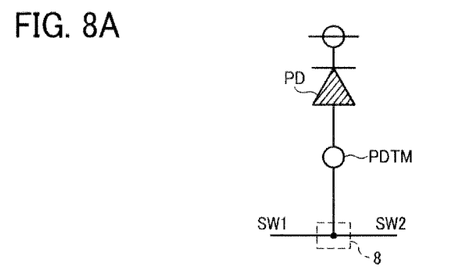
FIGS. 8A, 8B, and 8C are monitor current branch circuits according to embodiments in the aspect of this disclosure.
Figure 8B:
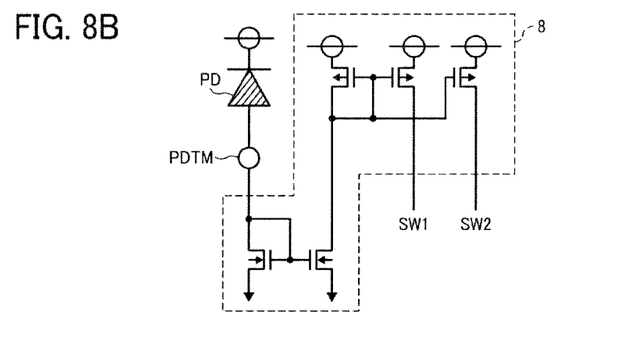
Figure 8C:
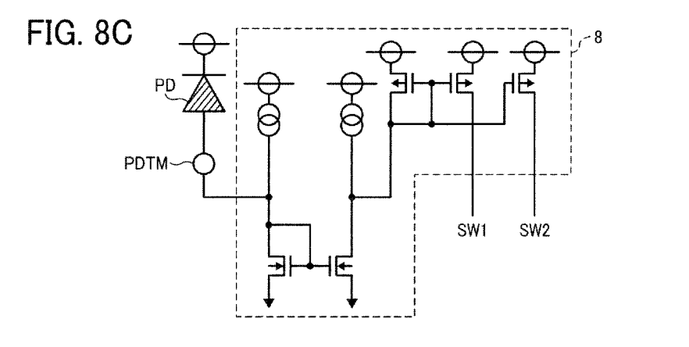

FIGS. 8A, 8B, and 8C are circuit diagrams of the monitor current branch unit 8. In the monitor current branch unit 8 shown in FIG. 8A, the PD monitor current from the photo diode PD corresponding to the laser diode LD1 or LD2 is output to the switch SW1 or SW2 directly without amplification as the first monitor current.

In the monitor current branch unit 8 shown in FIG. 8B, the PD monitor current from the photo diode PD flows a first current mirror circuit, and is amplified in the current mirror circuit. Then, the amplified current may further amplified by a second current mirror circuit, and then the further amplified current is supplied to the switch SW1 or SW2 as the first monitor current.

In the monitor current branch unit 8 shown in FIG. 8C, a bias current generated by a constant current generator is added to one of the current mirror circuit in the circuit configuration of FIG. 8B. Especially in the circuit of FIG. 8C, since a bias current flows constantly through the photo diode PD, it is possible to reduce the effect of parasitic capacitance of the photo diode PD on the outside circuitry, providing the advantage of obtaining a high-speed response of the photo diode PD. In the circuit configurations of FIGS. 8B and 8C, it is possible to amplify the current easily by making the sizes of input and output transistors of the current mirror circuit different.

Referring back to FIG. 1A, the first monitor current from the monitor current branch unit 8 flows towards the PD monitor current voltage conversion circuit connection terminal TM1 or TM2 through the corresponding switch SW1 or SW2. Then, the first monitor current is converted to a voltage by the monitor current voltage conversion resistor 6a or 6b. At the conversion process, the laser diodes LD1 and LD2 are controlled by the APC controllers 4a and 4b so that the converted voltage becomes a desired voltage to obtain a predetermined quantity of light of the laser diode. Each driver unit in the APC controller 4a and 4b outputs a proper amount of the first drive current to the corresponding laser diodes LD1 and LD2.

The semiconductor laser diode drive circuit 2 includes lines (circuit component) separately for the laser diodes LD1 and LD2 from the monitor current branch unit 8 to the laser diodes LD1 and LD2. That is, the number of circuit components connected between the monitor current branch unit 8 and the laser diodes LD1 and LD2 is equal to the number of the laser diodes LD1 and LD2.

In FIG. 1A, since the photo diode PD is connected to the PD connection terminal PDTM, the PD connection detector 10 detects a connection of the photo diode PD. Accordingly, the semiconductor laser diode drive circuit 2 according to the first embodiment is set in the multi beam laser drive mode so that the switches SW1 and SW2 provided on the path through which the first monitor current flows can be switched on and off as required. The switches SW1 and SW2 are configured to be switched off so that the monitor current of one of the laser diode (for example, LD2) can be cut off while the APC is performed with respect to the other laser diode (for example, LD1) in a case where the monitor current branch unit 8 bifurcates the first monitor current directly as shown in FIG. 8A.

(1-2 Operation in the Single Beam Laser Connection)

Referring to FIG. 1B, since the photo diode PD is not connected to the PD connection terminal PDTM, the PD connection detector 10 detects a non-connection of the photo diode PD. Accordingly, the single beam laser drive mode is set in the semiconductor laser diode drive circuit 2 according to the first embodiment. The switches SW1 and SW2 provided on the path through which the first monitor current flows, provided between the photo diode PD and the monitor current voltage conversion circuit connection terminals TM1 and TM2 are opened unconditionally. In this case as shown in FIG. 1B, the semiconductor laser diode drive circuit 2 includes two single beam units eventually.

In the respective single beam units described above, the photo diodes PD1 and PD2 are connected to the monitor current voltage conversion circuit connection terminals TM1 and TM2, respectively. The photo diodes PD1 and PD2 receive the laser light from corresponding laser diodes LD1 and LD2, respectively. When the photo diodes PD1 and PD2 receive the laser light, the photo diodes PD1 and PD2 feed the second monitor currents corresponding to the quantity of light of the laser diodes LD1 and LD2, respectively.

The second monitor currents generated by the laser diodes LD1 and LD2 flow to the monitor current voltage conversion resistors 6a and 6b through the monitor current voltage conversion circuit connection terminals TM1 and TM2, respectively. Then, the second monitor current is converted to a voltage by the monitor current voltage conversion resistors 6a and 6b. The converting voltage is controlled by the APC controllers 4a and 4b so that the converting voltage becomes a desired voltage to obtain a predetermined quantity of light. Each driver unit in the APC controller 4a and 4b outputs a proper amount of the second drive current to the corresponding laser diodes LD1 and LD2. Thus, it becomes possible to drive each laser diode LD1 and LD2 independently.

As described above, by introducing the PD connection detector 10 in the semiconductor laser diode drive circuit 2, it becomes possible to switch the circuit configuration automatically between the circuit configuration for the multi beam laser drive mode and the circuit configuration for the single beam laser drive mode, based on the detection information whether or not the photo diode PD is connected to the PD connection terminal PDTM.

Further, as described above, using the semiconductor laser diode drive circuit 2 according to the embodiment, there is no need to develop the special semiconductor laser drive circuits dedicated to the multi beam laser method and to the single beam laser method at each development. Accordingly, it is possible to shorten the development term because the semiconductor laser diode drive circuit according to the embodiment can handle both cases. Further, it is possible to reduce a circuit board implementation area compared to a system in which multiple special semiconductor laser drive circuits dedicated to the single beam laser method are employed, thus achieving a compact apparatus.

Further, the entire system can be configured with a common architecture for the image forming apparatuses in which multiple laser diodes for single channel operation are driven and the image forming apparatuses in which laser diodes for multi-channel operation are driven. Consequently, when multiple different types of image forming apparatuses are developed at a time, it is possible to save the total cost.

The semiconductor laser diode drive circuit 2 according to the first embodiment shown in FIGS. 1A and 1B may be formed on multiple chips and may be formed on a single chip by being integrated. When the semiconductor laser diode drive circuit 2 is integrated on a single chip, it is possible to achieve a compact image forming apparatus that mounts the semiconductor laser diode drive circuit 2 according to the embodiment.

(1.2 Operation Signals for APC Controllers)

Figure 2:
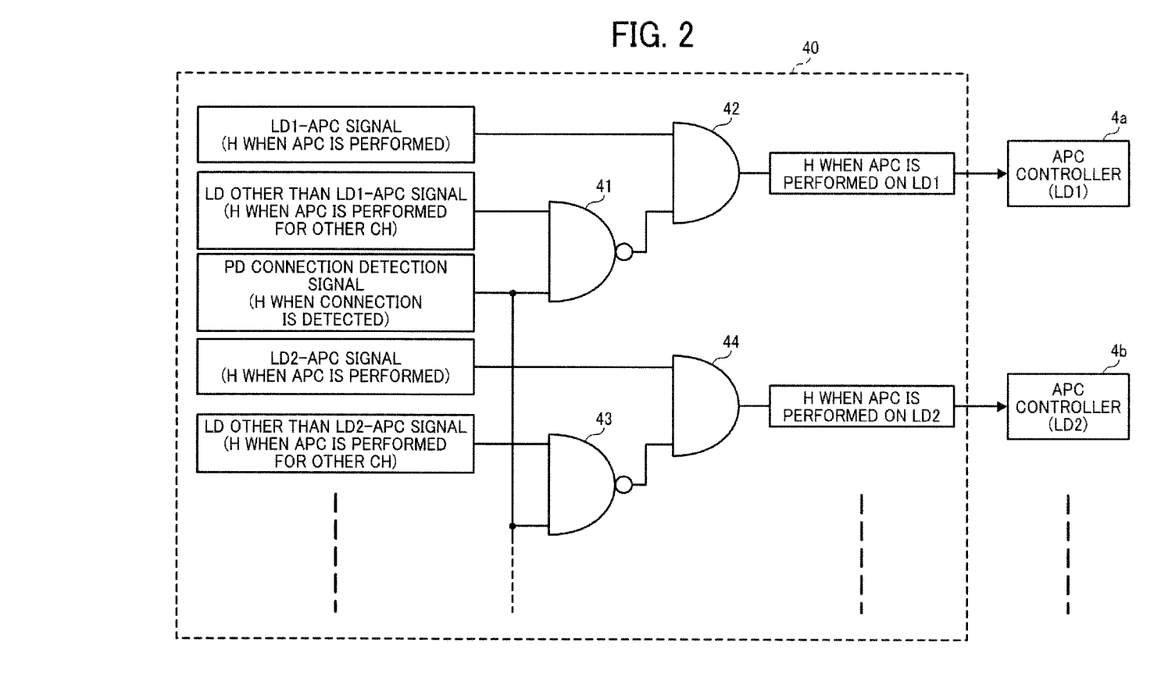
FIG. 2 is a circuit diagram of a system that generates a signal to perform an APC operation in the semiconductor laser diode drive circuit according to the first embodiment.

FIG. 2 is a schematic view of diagram of a circuit 40 that generates a signal to cause the APC controllers 4a and 4b in the semiconductor laser diode drive circuit 2 according to the embodiment to operate. The circuit 40, serving as a controller operation signal operator, includes two NAND circuits 41 and 43 and two AND circuits 42 and 44.

Signals represented as "LD1-APC signal" and "LD2-APC signal" in FIG. 2 are external APC signals. These APC signals indicate that the laser diode for corresponding channel is under APC when the APC signal is a high level.

A signal represented by the description "LD other than LD1-APC signal" is also an external APC signal, and indicates that the laser diodes other than LD1 are under APC when this signal is a high level. Similarly, a signal represented as "LD other than LD2-APC signal" is a signal similar to those described above.

Further, a signal represented as "PD connection detection signal" is a signal that is output when the PD connection detector 10 detects the connection of the photo diode PD. The signal represented as "PD connection detection signal" is a high level when the PD connection detector 10 detects the connection of the photo diode PD, and is a low level when the PD connection detector 10 detects the non-connection of the photo diode PD.

As shown in FIG. 2, the NAND circuit 41 outputs a negative AND of the signals "LD other than LD1-APC signal" and "PD connection detection signal". Further, the AND circuit 42 outputs an AND of the output signal from the NAND circuit 41 and "LD1-APC signal". The output signal from the AND circuit 42 is input to the APC controller 4a to control the laser diode LD1.

First, operation in the multi beam laser drive mode is described.

In the multi beam laser drive mode, only one of the multiple laser diodes LD1 and LD2 is under APC at a time. For example, the output signal that is input from the AND circuit 42 and is output to the APC controller 4a to control the laser diode LD1 becomes a high level when the laser diode LD1 is to be under APC. More specifically, the system is set to the multi beam laser drive mode when the PD connection detector 10 detects the connection of the photo diode PD. Under this condition, when one laser diode, for example, LD1, is under APC, the circuit 42 generates such input signals, to the APC controllers 4a and 4b, that other diodes (for example, the laser diode LD2 in the circuitry shown in FIG. 1A) is not under APC.

In this condition, a signal of "LD2-APC signal" of a low level is input to the AND circuit 44 that outputs a signal to the APC controller 4b for laser diode LD2. Accordingly, the APC controller 4b controls the laser diode LD2 not to operate.

Next, operation in the single beam laser drive mode is described.

When the PD connection detector 10 detects a non-connection of the photo diode PD and the single beam laser drive mode is set in the semiconductor laser diode drive circuit 2, the signal represented by description "PD connection detection signal" is a low level. Accordingly, signals from the NAND circuits 41 and 43 input to the AND circuits 42 and 44 become obviously a high level. With this configuration, even if one diode (for example, LD1) is under APC, it is possible to arrange a set of input signals to the APC controllers 4a and 4b so that the laser diodes other than the laser diode which is under APC (LD other than LD1, for example, LD2) can be under APC. More specifically, it may be possible to form a set of input signals so as to allow every APC controller 4a and 4b for laser diodes LD1 and LD2 to perform the APC operation.

The circuit shown in FIG. 2 generates a set of signals that cause the respective APC controllers 4a and 4b to operate properly in both modes, the multi beam laser drive mode and the single beam laser drive mode.

(1.3 Controlling the Drive Current for the Laser Diodes)

Figure 3:
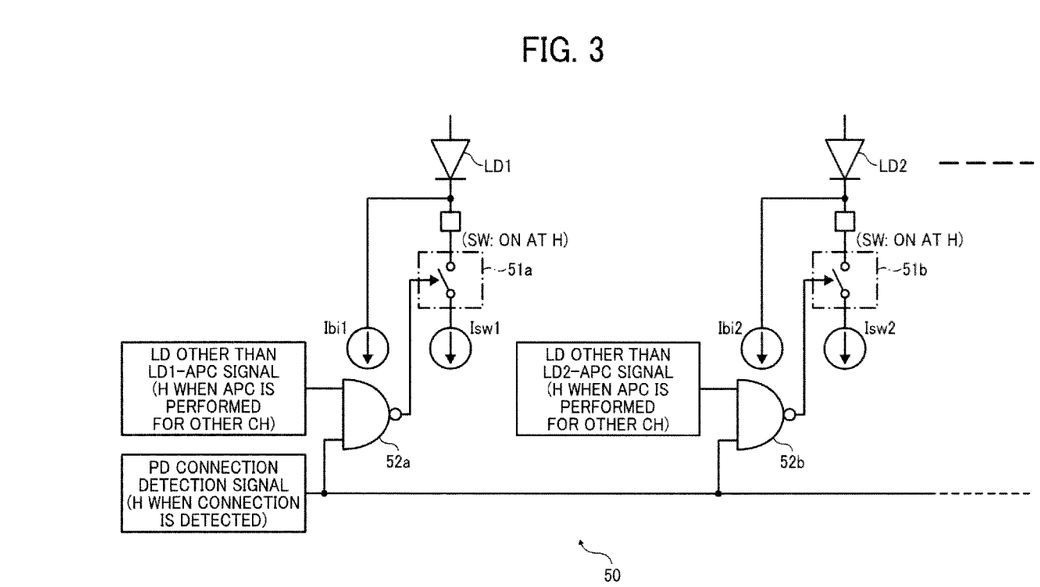
FIG. 3 is a circuit diagram of a system that controls a current amount to drive a laser diode in the semiconductor laser diode drive circuit according to the first embodiment.

FIG. 3 is a schematic view of a diagram of a circuit 50 that controls drive current amounts to drive the laser diodes in the semiconductor laser diode drive circuit 2 according to the embodiment. The circuit 50, serving as an individual laser diode drive current amount controller, includes two switches 51a and 51b and two NAND circuits 52a and 52b.

When the instruction data to turn the laser diode on is not assigned and the laser diode is to be turned off (hereinafter "off state") (that is data off), the drive current is generally restricted to a current less than a laser oscillation threshold current Ith. This current is to avoid a delay of the laser oscillation at a transition from a condition where the laser is completely off to a condition where the laser emits light (hereinafter "on state").

In the circuit shown in FIG. 3, currents Ibi1, Ibi2 and so on are currents less than the laser oscillation threshold current Ith to be flown in data off condition. For example, Ibi1 is a current to be flown through the laser diode LD1 when the laser diode LD1 is turned off.

At the kth laser diode, a drive current Iop(k) to obtain a desired light quality is defined by the following formula, $$Iop(k) = Ibi(k) + Isw(k),$$

where k is a positive integer greater than one.

In the formula of this definition, a term Isw(k) means a switching current which switches the laser diode on and off according to an assignment of an image data.

In the multi beam laser method, a plurality of laser diodes (LD1, LD2, . . . LDk) are assigned to the photo diode PD. Accordingly, if multiple laser diodes are in the on state, the photo diode PD generates the first monitor current corresponding to the total quantity of light of the laser diodes. Further, in the semiconductor laser diode drive circuit 2 shown in FIG. 1A, in a case in which while APC is performed on one laser diode, when the other laser diode emits light, the quantity of light becomes excessive.

Accordingly, when the multi beam laser method is set in the semiconductor laser diode drive circuit 2 according to the embodiment, if one laser diode is under APC, the laser diodes other than the laser diode which is under APC are needed to be turned off. More specifically, when the laser diode LD1 is under APC, the drive currents to the laser diodes other than the laser diode LD1 are set to be a current less than the laser oscillation threshold currents Ith, that are Ibi2, Ibi3, and so on, respectively.

In the circuit shown in FIG. 3, a negative AND of "PD connection detection signal" and "LD other than LD1-APC signal" is formed by the NAND circuit 52a, and is input to the switch 51a connecting directly to the laser diode LD1. The switch 51a is configured to be on only when the signal from the NAND circuit 52a is a high level. When the laser diode LD1 is under APC in the multi beam laser drive mode, the signal "PD connection detection signal" output from the PD connection detector 10 is a high level, and "LD other than LD1-APC signal" is a low level. In such a case, the NAND circuit 52a outputs a high level. This high level signal makes the switch 51a connecting directly to the laser diode LD1 on. Accordingly, a drive current (first drive current) of sum of Ib1 and Isw1 flows through the laser diode LD1. Thus, the laser diode LD1 is under APC by this current.

On the other hand, a negative AND of "PD connection detection signal" and "LD other than LD2-APC signal" is formed by the NAND circuit 52b, and is input to the switch 51b connecting directly to the laser diode LD2. The switch 51b is configured to be on only when the signal from the NAND circuit 52b is a high level. Accordingly, when the laser diode LD1 is under APC in the multi beam laser drive mode, the signal "PD connection detection signal" output from the PD connection detector 10 is a high level, and "LD other than LD2-APC signal" becomes a high level. As a result, the NAND circuit 52b outputs a low level. This low level signal makes the switch 51b connecting directly to the laser diode LD1 off. Consequently, only a current of Ib2 flows through the laser diode LD2. Thus, the laser diode LD2 is set in the off state by this current.

Further, if more laser diode, for example, a laser diode LD3 is employed, a drive current to that of the laser diode LD2 flows through the laser diode LD3 similarly.

Thus, the drive current flowing through the laser diode LD1 becomes Ibi1+Isw1, and the drive current flowing through the laser diode LD2 is Ibi2 only. Accordingly, a sufficient quantity of light for performing APC with respect to the laser diode LD1 is kept properly. Further, when the other laser diode, for example, the laser diode LD2 is under APC, similar operation may be performed.

In the circuit 50 shown in FIG. 3, it is accepted that the forward drive current Ibi (k) flows when the data for laser diode is off.

However, depending on the circuit configuration, even if the drive current is less than the laser oscillation threshold current value Ith, a week light emission may occur and affect APC operation. In such a semiconductor laser diode drive circuit, when APC is performed on one laser diode, the drive current to the laser diodes other than the laser diode under APC may be completely cut off, (Ibi (k) may be cut off).

In the circuit shown in FIG. 3, when the circuit is set to the single beam laser drive mode, the signal "PD connection detection signal" is a low level, every output signal from the NAND circuits 52a and 52b becomes a high level. Accordingly, the switches 51a and 51b connecting directly to the laser diodes LD1 and LD2, are switched on. The second drive current flowing through the corresponding laser diode becomes a current value expressed as $$Iop(k)=Ibi(k)+Isw(k),$$

Accordingly, every laser diode (LD1, LD2 . . . LDk) is set in the on state. That is, a current (second drive current), larger than a predetermined laser oscillation threshold current value Ith is supplied to every laser diode. Thus, even when every laser diode is in the on state, since the photo diodes PD1 and PD2 detect the laser emission from the corresponding laser diodes, respectively, it is possible to perform APC control properly on the respective laser diodes.

(1.4 PD Detection)

Figure 4A:
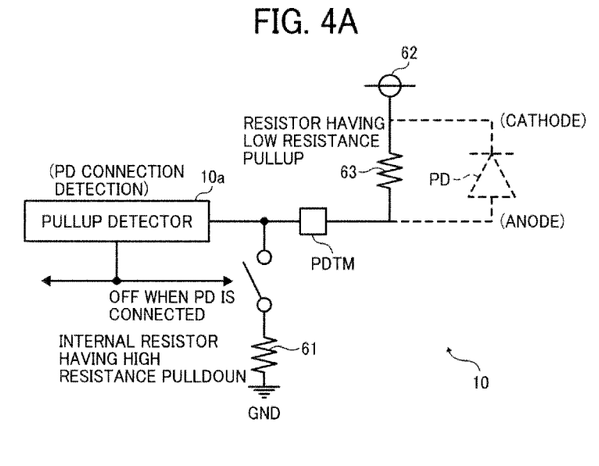
FIGS. 4A and 4B are circuit diagrams of a PD connection detector in the semiconductor laser diode drive circuit according to the first embodiment.
Figure 4B:
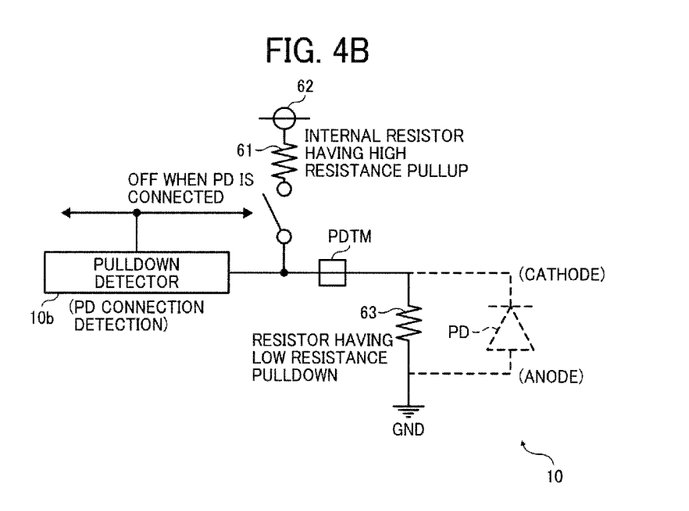

FIGS. 4A and 4B illustrate circuit diagrams of the PD connection detector 10 used in the semiconductor laser diode drive circuit 2 according to the embodiment. Those are simple example circuits that can detect the connection of the photo diode PD particularly when the laser diodes are turned off.

In the semiconductor laser diode drive circuit shown in FIG. 4A in which anode of the photo diode PD is connected to the PD connection terminal PDTM, a potential of the PD connection terminal PDTM is a high impedance state "HiZ". Accordingly, in this embodiment, a resistor 61 having a high resistance is connected internally between the PD connection terminal PDTM and ground to make a pull-down circuit. Therefore, the PD connection terminal PDTM is fixed to a low level when the photo diode PD is connected.

Further, when the photo diode PD is not connected, a resistor 63 having a low resistance is connected to the PD connection terminal PDTM between the PD connection terminal PDTM and a power supply terminal 62 to make a pull-up circuit instead of the photo diode PD. Thus, the PD connection terminal PDTM is fixed to a high level when the photo diode PD is not connected. Consequently, as shown in FIG. 4A, it is possible to form the PD connection detector 10 easily by adding a pull-up detector 10a in the semiconductor laser diode drive circuit.

When the connection of the photo diode PD is detected as described above, it is preferable to disconnect the internal resistor 61 having a high resistance provided for making the pull-down connection so as to avoid the monitor current error.

Further, it is preferable to perform this PD connection detection operation of the connection of the photo diode PD immediately before the start-up of the semiconductor laser diode drive circuit 2, which is immediately after a release of a reset operation.

FIG. 4B shows another example circuit of the PD connection detector 10 used in the semiconductor laser diode drive circuit. In the semiconductor laser diode drive circuit shown in FIG. 4B, a cathode of the photo diode PD is connected to the PD connection terminal PDTM.

Contrary to the circuit shown in FIG. 4A, the PD connection detector 10 is formed by adding a pull-down detector 10b in the semiconductor laser diode drive circuit 2. Herein, the resistor 61 functions as a high resistor and the resistor 63 functions as a lower resistor.

2. Second Embodiment

Figure 5A:
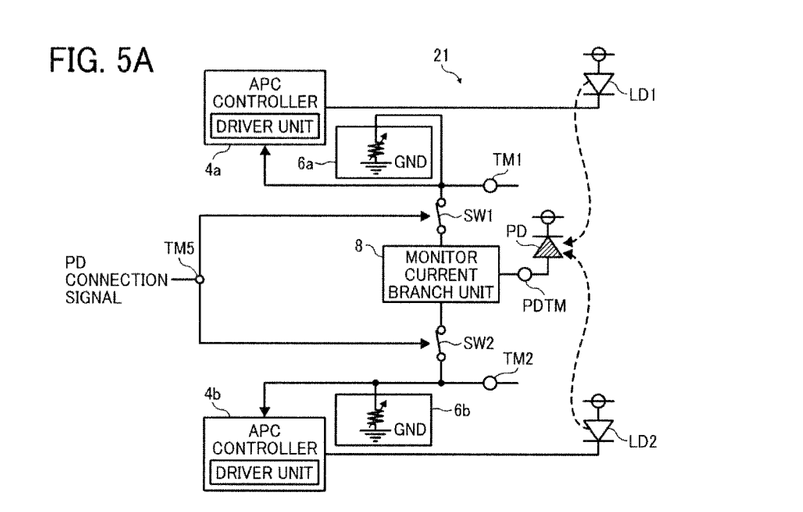
FIGS. 5A and 5B are overall circuit diagrams of a semiconductor laser diode drive circuit according to a second embodiment.
Figure 5B:
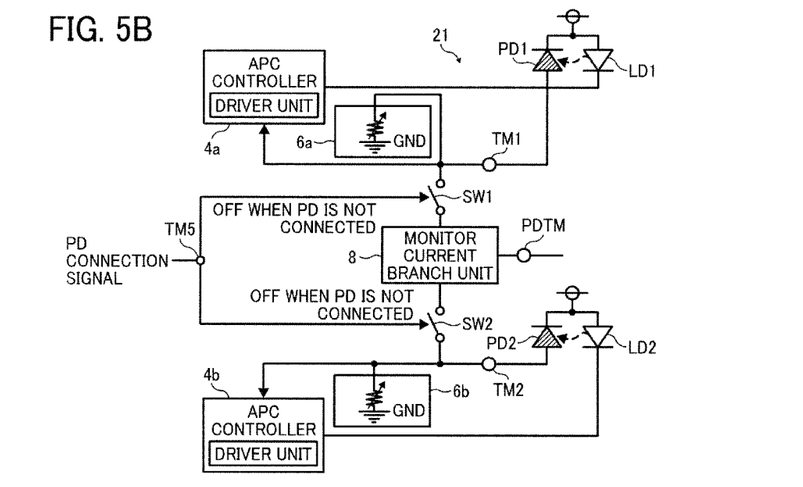

FIGS. 5A and 5B are overall circuit block diagrams of a semiconductor laser diode drive circuit 21 according to an illustrative second embodiment.

The semiconductor laser diode drive circuit 21 according to the second embodiment has the similar configuration to that of the semiconductor laser diode drive circuit 2 according to the first embodiment.

Accordingly, the same units as that in the semiconductor laser diode drive circuit 2 according to the first embodiment are shown with the same suffix reference numerals, and the descriptions thereon are omitted, and a description relating only to the different part is described.

In the semiconductor laser diode drive circuit 2 according to the first embodiment shown in FIG. 1, the PD connection detector 10 detects whether or not the photo diode PD is connected to the PD connection terminal PDTM. The resulting detection signal is used in the apparatus (for example, to switch the switches SW1 and SW2 on/off). By contrast, in the semiconductor laser diode drive circuit 21 according to the second embodiment shown in FIG. 5, the PD connection detector 10 is not included, but an external signal indicating PD connection (PD connection signal) is input to an input terminal TM5.

Accordingly, in the semiconductor laser diode drive circuit 21 according to the second embodiment, the switches SW1 and SW2, provided on the path through which the first monitor current flows and provided between the photo diode PD and the monitor current voltage conversion circuit connection terminals TM1 and TM2, are controlled by the PD connection signal input through the external input terminal TM5.

Figure 6:
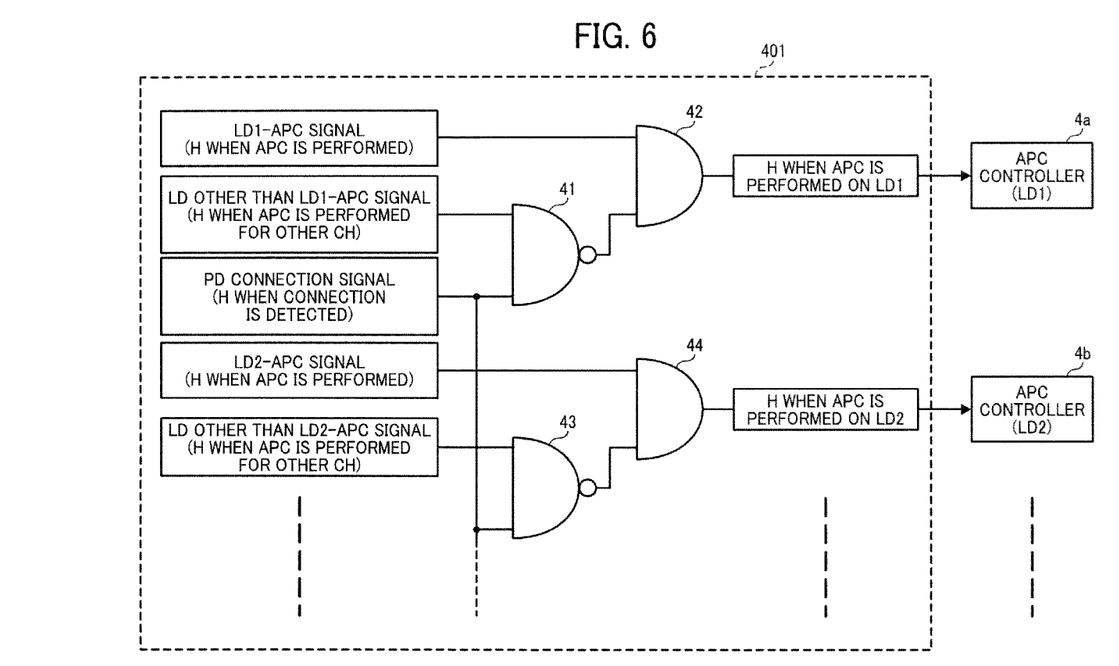
FIG. 6 is a circuit diagram of a system that generates a signal to perform an APC operation in the semiconductor laser diode drive circuit according to the second embodiment.

FIG. 6 is a schematic diagram illustrating a circuit 401 that generates a signal to make the APC control units 4a and 4b in the semiconductor laser diode drive circuit 21 according to the second embodiment to operate. Compared with the circuit that generates a signal to make the APC control units in the semiconductor laser diode drive circuit according to the first embodiment shown in FIG. 2 to operate, the PD connection detection signal is replaced by the external PD connection signal. The other circuit configurations are the same as that of the laser diode drive circuit shown in FIG. 2.

Figure 7:
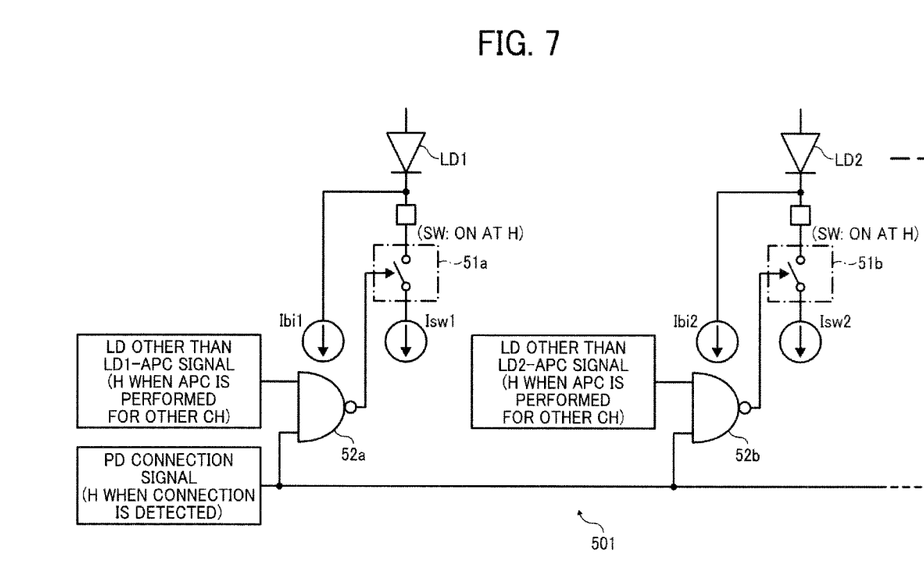
FIG. 7 is a circuit diagram of a system that controls a current amount to drive a laser diode in the semiconductor laser diode drive circuit according to the second embodiment.

FIG. 7 is a schematic diagram illustrating a circuit 501 that controls a current amount to drive the laser diodes LD1 and LD2 in the semiconductor laser diode drive circuit 21 according to the second embodiment. Compared with the circuit 50 that controls drive current amounts to drive the laser diodes in the semiconductor laser diode drive circuit 2 according to the first embodiment, the PD connection detection signal is replaced by the external PD connection signal. The other circuit configurations are the same as that of the circuit shown in FIG. 3.

Similar results obtained by the first embodiment can be obtained by the second embodiment.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2010-044411 filed on Mar. 1, 2010 in the Japanese Patent Office, the entire contents of which are incorporated by reference herein.

What is claimed is:

1. A laser diode drive circuit to drive multiple laser diodes under automatic power control (APC), the laser diode drive circuit comprising:
    a first photo diode to detect light emission amounts of the multiple laser diodes;
    multiple second photo diodes corresponding to the respective multiple laser diodes, to detect light emission amounts of the corresponding laser diodes, a number of the second photo diodes being the same as a number of the multiple laser diodes;
    a first photo diode connection terminal to connect the first photo diode;
    multiple second photo diode connection terminals to connect the multiple second photo diodes;
    multiple APC controllers provided for the respective multiple laser diodes, each of which controlling the light emission amount of one of the multiple laser diodes automatically based on a first monitor current from the first photo diode connected to the first photo diode connection terminal or a second monitor current from a respective one of the multiple second photo diodes connected to the corresponding multiple second photo diode connection terminals;
    a monitor current path, formed between the first photo diode connection terminal and the respective multiple APC controllers, through which the first monitor current flows from the first photo diode connection terminal to the corresponding multiple APC controller;
    multiple switches provided for the respective multiple laser diodes, disposed between the monitor current path and the respective multiple APC controllers, to connect and disconnect the monitor current path with the respective APC controllers; and
    a detector to detect whether or not the first photo diode is connected to the first photo diode connection terminal, and cause all of the switches to disconnect the monitor current path from the respective APC controllers when the first photo diode is not connected to the first photo diode connection terminal.

2. The laser diode drive circuit of claim 1, further comprising a controller operation signal generator to generate signals that cause the multiple APC controllers to operate, respectively,
    wherein, when the detector detects that the first photo diode is connected to the first photo diode connection terminal, the controller operation signal generator generates a signal to inhibit the multiple APC controllers from operating except one of the APC controller that currently controls the corresponding laser diode under APC, and,
    when the detector detects that the first photo diode is not connected to the first photo diode connection terminal, the controller operation signal generator generates a signal to allow all of the multiple APC controllers for the multiple laser diodes to operate.

3. The laser diode drive circuit of claim 1, further comprising an individual laser diode drive current amount controller to control amounts of first drive currents and second drive currents for the multiple laser diodes,
    wherein, when the detector detects that the first photo diode is connected to the first photo diode connection terminal, the individual laser diode drive current amount controller controls the APC controllers to supply the multiple laser diodes except one of the laser diodes under APC with the first drive currents that are less than a predetermined current, and,
    when the detector detects that the first photo diode is not connected to the first photo diode connection terminal, the individual laser diode drive current amount controllers controls the APC controllers to supply all of the multiple laser diodes with the second drive currents that are larger than a predetermined current.

4. The laser diode drive circuit of claim 1, wherein in a case in which the anode of the first photo diode is connected to or disconnected from the first photo diode connection terminal, the detector detects a non-connection of the first photo diode with the first photo diode connection terminal by detecting a pull-up condition formed by a pull-up circuit of a low resistor provided externally and a pull-down circuit of a high resistor provided internally in a off state of the laser diode.

5. The laser diode drive circuit of claim 1, wherein in a case in which the cathode of the first photo diode is connected to or disconnected from the first photo diode connection terminal, the detector detects non-connection of the first photo diode with the first photo diode connection terminal by detecting pull-down condition formed by a pull-down circuit of a low resistor provided externally and a pull-up circuit of a high resistor provided internally in a off state.

6. The laser diode drive circuit of claim 1, wherein the laser diode drive circuit is integrated on a single chip.

7. An image forming apparatus, comprising the laser diode drive circuit of claim 1.

* * * * *